(12) United States Patent
Eom et al.

(10) Patent No.: US 11,830,923 B2
(45) Date of Patent: Nov. 28, 2023

(54) RF SWITCH DEVICE

(71) Applicant: DB HiTek Co., Ltd., Bucheon-si (KR)

(72) Inventors: Seung Hyun Eom, Seoul (KR); Jin Hyo Jung, Suwon-si (KR); Hae Taek Kim, Bucheon-si (KR); Ja Geon Koo, Eumseong-gun (KR); Ki Won Lim, Suwon-si (KR); Hyun Joong Lee, Daejeon (KR); Sang Yong Lee, Chungju-si (KR)

(73) Assignee: DB HiTek, Co., Ltd., Bucheon-si (KR)

( * ) Notice: Subject to any disclaimer, the term of this patent is extended or adjusted under 35 U.S.C. 154(b) by 0 days.

(21) Appl. No.: 17/718,055

(22) Filed: Apr. 11, 2022

(65) Prior Publication Data

US 2022/0336620 A1 Oct. 20, 2022

(30) Foreign Application Priority Data

Apr. 16, 2021 (KR) .................. 10-2021-0049526

(51) Int. Cl.
*H01L 29/49* (2006.01)
*H01L 29/06* (2006.01)
*H01L 23/528* (2006.01)

(52) U.S. Cl.
CPC ...... *H01L 29/4991* (2013.01); *H01L 29/0653* (2013.01); *H01L 23/528* (2013.01)

(58) Field of Classification Search
CPC . H01L 21/764; H01L 21/768; H01L 21/7682; H01L 21/76816; H01L 21/8234; H01L 21/823475; H01L 29/06; H01L 29/49; H01L 29/4991; H01L 29/0653; H01L 27/02; H01L 27/088; H01L 27/0207; H01L 23/522; H01L 23/528; H01L 23/532; H01L 23/485; H01L 23/5222; H01L 23/53295; H01L 29/1041; H01L 29/1045; H01L 29/66575; H01L 29/806; H01L 29/66598; H01L 29/66659; H01L 29/66636; H01L 29/7839; H01L 29/41725; H01L 29/41791
USPC ........................................................ 257/522
See application file for complete search history.

(56) References Cited

U.S. PATENT DOCUMENTS

| 6,566,241 | B2 | 5/2003 | Chun | |
|---|---|---|---|---|
| 2002/0146899 | A1 | 10/2002 | Chun | |
| 2007/0111508 | A1* | 5/2007 | Hayashi | ........... H01L 21/76802 438/622 |
| 2022/0336620 | A1* | 10/2022 | Eom | ................... H01L 21/7682 |

FOREIGN PATENT DOCUMENTS

KR 10-2002-0078310 A 10/2002

* cited by examiner

*Primary Examiner* — Chuong A Luu
(74) *Attorney, Agent, or Firm* — Andrew D. Fortney; Central California IP Group, P.C.

(57) ABSTRACT

Disclosed is an RF switch device and, more particularly, an RF switch device having an air gap over a gate electrode and a metal interconnect at a position higher than the air gap and that at least partially overlap the air gap in the vertical direction, thereby preventing exposure of an upper portion of the air gap in subsequent processing.

4 Claims, 14 Drawing Sheets

RF SWITCH DEVICE

CROSS REFERENCE TO RELATED APPLICATION(S)

The present application claims priority to Korean Patent Application No. 10-2021-0049526, filed on Apr. 16, 2021, the entire contents of which are incorporated herein.

TECHNICAL FIELD

The present disclosure relates to an RF switch device and, more particularly, to an RF switch device having an air gap over a gate electrode and a metal interconnect at a position higher than the air gap and that at least partially overlaps the air gap in the vertical direction, thereby preventing exposure of an upper portion of the air gap in subsequent processing.

BACKGROUND ART

Semiconductor devices are becoming highly integrated, and accordingly, the separation distance between metal interconnects at the same level to source and drain terminals of the devices tends to become smaller as new generations of device manufacturing technology are developed. However, as the metal interconnects become closer together, crosstalk occurs between the adjacent metal structures, and parasitic capacitance may increase.

In other words, as the size of the semiconductor devices decrease, parasitic capacitance through coupling between the metal interconnects naturally occurs, and the increase in the parasitic capacitance increases the size of a delay constant (RC), which is inversely proportional to the signal propagation speed. In short, the increase in the parasitic capacitance lowers the overall signal propagation speed of the device, resulting in deterioration of semiconductor device characteristics. The same problem occurs in a radio frequency (RF) switch device, and thus, the figure of merit (FOM) of the RF switch device may increase. FOM may be quantified as the product of the on-resistance (Rsp) and the parasitic capacitance of the device. Currently, various attempts are being made to solve the problem of device characteristic degradation caused by the increase in parasitic capacitance.

FIG. 1 is a partial cross-sectional view of a conventional RF switch device.

Hereinafter, the structure of the conventional switch device 900 will be described with reference to the accompanying drawings.

Referring to FIG. 1, the conventional switch device 9 includes a gate structure 910 on the upper surface of a substrate 901, and a source 920 and a drain 930, on or in the surface of the substrate 901 and spaced apart from each other.

In addition, a metal contact 940 is on the source 920, and a metal interconnect 950 is on the metal contact 940. The metal interconnect 950 is electrically connected to the metal contact 940. Another metal contact 942 is on the metal interconnect 950, and a second-level metal interconnect 952 is on the metal contact 942. A metal contact 960 is on the drain 930, and a metal interconnect 970 is on and electrically connected to the metal contact 960. Another metal contact 962 and metal interconnect 972 are on the drain metal 970.

As described above, integration of the RF switch is increasing, and accordingly, the separation distance between the metal interconnect 950 and the metal interconnect 970 at the same level in the device becomes smaller with successive generations of device designs. The metal interconnect 950 and the metal interconnect 970 are generally adjacent to each other. In order to lower parasitic capacitance, a material having a low dielectric constant may be between the metal interconnects 950 and 970, but such materials may be relatively inefficient in economic terms. As an alternative, an air gap 980 may be formed between the respective metal interconnects 950 and 970, and as the width W and the height H of the air gap 980 increase, the parasitic capacitance may decrease, and the device characteristics may improve. However, when the height H of the air gap 980 is larger than a certain height, there is a possibility that the upper end of the air gap 980 is exposed in subsequent processing.

To prevent this, a thick insulating film covering the upper end of the air gap 980 may be deposited, or the height H of the air gap 980 may be decreased. However, in the former case, the depth of the via for the contacts 942 and 952 also increases, making the process relatively difficult, which may be a factor in an increase in cost. In the latter case, there is a disadvantage in that the reduction in the parasitic capacitance by the air gap decreases.

To solve such problems, the present disclosure intends to present an improved RF switch device with a novel structure.

RELATED ART

Korean Patent Application Publication No. 10-2002-0078310, entitled "METHOD FOR FORMING METAL CONTACT IN SEMICONDUCTOR DEVICE"

SUMMARY OF THE INVENTION

The present disclosure has been made to solve the problems of the related art, and an objective of the present disclosure is to provide an RF switch device having an air gap on or over a gate electrode and a metal interconnect at a position higher than the air gap and at least partially overlapping or covering the air gap (e.g., in the vertical direction), thereby preventing exposure of an upper portion of the air gap in subsequent processing.

Moreover, an objective of the present disclosure is to provide an RF switch device that reduces parasitic capacitance by maintaining the width and height of the air gap and eliminates the need to form a thick insulating layer above the air gap, thereby facilitating the subsequent via-forming process and reducing costs.

Furthermore, an objective of the present disclosure is to provide an RF switch device in which second-level metal interconnects have a width sufficient to cover respective adjacent air gaps, thereby preventing exposure of the air gap and improving the on-resistance of the device.

Furthermore, an objective of the present disclosure is to provide an RF switch device that lowers parasitic capacitance by staggering individual source extension portions and drain extension portions along a first direction.

Furthermore, an objective of the present disclosure is to provide an RF switch device that may lower parasitic capacitance by including a contact hole having a length less than half the length of a corresponding gate electrode in a second direction, and a source extension portion and/or a drain extension portion on a side (e.g., of the active area) that does not include the contact hole having a width in a first direction that is smaller than the width in the first direction of the extension portion(s) on the side (e.g., of the active area) that includes the contact hole.

Furthermore, an objective of the present disclosure is to provide an RF switch device with a floating metal covering the air gap, without structural changes to the existing configuration.

The present disclosure may be implemented by embodiments having one or more of the following configurations in order to achieve the above-described objectives.

According to one or more embodiments of the present disclosure, an RF switch device according to the present disclosure includes a semiconductor layer; a gate electrode on the semiconductor layer; a source on or in the semiconductor layer; a drain on or in the semiconductor layer; a first source contact connected to the source; a first metal interconnect connected to the first source contact; a second source contact connected to the first metal interconnect; a second metal interconnect connected to the second source contact; a first drain contact connected to the drain; a third metal interconnect connected to the first drain contact; a second drain contact connected to the third metal interconnect; a fourth metal interconnect connected to the second drain contact; and air gaps over the gate electrodes and below the second metal interconnect and the fourth metal interconnect.

According to one or more other embodiments of the present disclosure, the second metal interconnect and/or the fourth metal interconnect of the RF switch device may at least partially cover an adjacent air gap (e.g., in a vertical or height direction).

According to yet one or more other embodiments of the present disclosure, the second metal interconnect and/or the fourth metal interconnect may have a width sufficient to cover at least half of a width of the adjacent air gap.

According to yet one or more other embodiments of the present disclosure, the second metal interconnect and/or the fourth metal interconnect have a width sufficient to cover adjacent air gaps along a first direction.

According to yet one or more other embodiments of the present disclosure, the second metal interconnect and the fourth metal interconnect may not overlap each other along the first direction.

According to yet one or more other embodiments of the present disclosure, an RF switch device includes a semiconductor layer; a gate electrode on the semiconductor layer; a source on the semiconductor layer; a drain on the semiconductor layer; a first source contact connected to the source; a first metal interconnect connected to the first source contact; a second source contact connected to the first metal interconnect; a second metal interconnect connected to the second source contact; a first drain contact connected to the drain; a third metal interconnect connected to the first drain contact; a second drain contact connected to the third metal interconnect; a fourth metal interconnect connected to the second drain contact; and air gaps over the gate electrodes and below the second metal interconnect and the fourth metal interconnect, wherein the second metal interconnect may include a source tab extending along a first direction to electrically connect a plurality of source extension portions, and the plurality of source extension portions, extending in a second direction from a first side of the source tab and spaced apart from each other in the first direction; the fourth metal interconnect may include: a drain tab extending along the first direction to electrically connect a plurality of drain extension portions and spaced apart from the source tab in the second direction, and the plurality of drain extension portions, extending in the second direction from the first side of the drain tab and spaced apart from each other in the first direction, and each of the second source extension portions or the second drain extension portions in the first direction has a width sufficient to cover an adjacent one of the air gaps.

According to yet one or more other embodiments of the present disclosure, the RF switch device further includes a lower insulating layer on the semiconductor layer; an intermediate insulating layer on the lower insulating layer; and an upper insulating layer on the middle insulating layer, wherein the lower insulating layer may include a first contact hole through which the first source contact and the first drain contact pass, the intermediate insulating layer may include a second contact hole through which the second source contact and the second drain contact pass, and the upper insulating layer may include: a third contact hole through which the second source contact and the second drain contact pass.

According to yet one or more other embodiments of the present disclosure, the second source extension portions and the adjacent second drain extension portions may not overlap each other along the first direction.

According to yet one or more other embodiments of the present disclosure, the air gap may not be at a point where the second source extension portions and the adjacent drain extension portions do not overlap each other along the first direction.

According to yet one or more other embodiments of the present disclosure, an RF switch device includes a semiconductor layer; a gate electrode on the semiconductor layer; a source on the semiconductor layer; a drain on the semiconductor layer; a first source contact connected to the source; a first metal interconnect connected to the first source contact; a second source contact connected to the first metal interconnect; a second metal interconnect including a source tab connected to the second source contact and extending along a first direction to electrically connect a plurality of source extension portions, the plurality of source extension portions extending in a second direction from the first side of the source tab and spaced apart from each other in the first direction; a first drain contact connected to the drain; a third metal interconnect connected to the first drain contact; a second drain contact connected to the third metal interconnect; a fourth metal interconnect including a drain tab connected to the second drain contact, and extending along the first direction to electrically connect a plurality of drain extension portions and spaced apart from the source tab in the second direction, the plurality of drain extension portions extending in the second direction from the first side of the drain tab and spaced apart from each other in the first direction; and an air gap over the gate electrode and below the second metal interconnect and the fourth metal interconnect, wherein the second source contact and the second drain contact may have a length less than half a length of the gate electrode extending in the second direction, and the source extension portion has a width in the first direction on a side not in contact with any of the second source contacts that may be smaller than on a side in contact with the second source contact.

According to yet one or more other embodiments of the present disclosure, the second source contact and the second drain contact may be inside contact holes in insulating layers in a vertical direction, and the contact holes may be alternatingly offset from each other along the first direction.

According to yet one or more other embodiments of the present disclosure, the RF switch device further includes a lower insulating layer on the semiconductor layer; an intermediate insulating layer on the lower insulating layer; and an upper insulating layer on the middle insulating layer, wherein the contact holes may be in the middle insulating layer and the upper insulating layer.

According to yet one or more other embodiments of the present disclosure, the RF switch device includes a semiconductor layer; a gate electrode on the semiconductor layer; a source on the semiconductor layer; a drain on the semiconductor layer; a first source contact connected to the source; a first metal interconnect connected to the first source contact; a second source contact connected to the first metal interconnect; a second metal interconnect including a source tab connected to the second source contact and extending along a first direction to electrically connect a plurality of source extension portions; the plurality of source extension portions extending in a second direction from the first side of the source tab and spaced apart from each other in the first direction; a first drain contact connected to the drain; a third metal interconnect connected to the first drain contact; a second drain contact connected to the third metal interconnect; a fourth metal interconnect including a drain tab connected to the second drain contact, and extending along the first direction to electrically connect a plurality of drain extension portions and spaced apart from the source tab in the second direction; the plurality of drain extension portions extending in the second direction from the first side of the drain tab and spaced apart from each other in the first direction; an air gap over the gate electrode and below the second metal interconnect and the fourth metal interconnect; and a floating metal covering the air gap.

According to yet one or more other embodiments of the present disclosure, the floating metal may cover at least the uppermost end of the air gap.

According to yet one or more other embodiments of the present disclosure, the second source contact and the second drain contact may be inside contact holes penetrating insulating layers in a vertical direction, wherein the contact holes may be alternatingly offset from each other along the first direction.

According to yet one or more other embodiments of the present disclosure, the source extension portions and the drain extension portions may extend along the second direction only on the side of the contact holes.

According to yet one or more other embodiments of the present disclosure, the floating metal may not be connected to the source or the drain.

According to yet one or more other embodiments of the present disclosure, the floating metal may be at a height between the first metal interconnect and the second metal interconnect.

The above configurations may have one or more of the following effects.

The above configurations can prevent exposure of the air gap in subsequent processing by configuring the metal interconnect to at least partially overlap the air gap in the vertical direction.

In addition, the above configurations can facilitate the via formation process and reduce costs by eliminating the need to form a relatively thick insulating layer above the air gap while reducing parasitic capacitance by maintaining the width and height of the air gap.

Furthermore, the above configurations can prevent exposure of the air gap and improve on-resistance of the device since the width of the second metal interconnect and the width of the fourth metal interconnect may cover part or all of the adjacent air gaps.

Furthermore, the above configurations can lower parasitic capacitance by arranging individual source extension portions and drain extension portions so as not to overlap each other along the first direction.

Furthermore, the above configurations can lower parasitic capacitance by including a contact hole having a length less than half the length of a corresponding gate electrode in the second direction, and a source extension portion and/or drain extension portion having a width in the first direction on a side (e.g., of the active area) not in contact with any of the source or drain contacts that is smaller than the width on a side in contact with the corresponding source or drain contact.

Furthermore, when the above configurations floating metal on the air gap, the air gap is easily covered without structural changes to the existing configuration.

Meanwhile, it should be added that even if effects not explicitly mentioned herein, the effects described in the following specification expected by the technical features of the present disclosure and their potential effects are treated as if they were described herein.

DETAILED DESCRIPTION

Hereinafter, embodiments of the present disclosure will be described in more detail with reference to the accompanying drawings. The embodiments of the present disclosure may be modified in various forms, and the scope of the present disclosure should not be construed as being limited to the following embodiments, but should be construed based on the claims. In addition, these embodiments are only provided for reference in order to more completely explain the present disclosure to those of ordinary skill in the art.

As used herein, the singular form may include the plural form unless the context clearly dictates otherwise. Furthermore, as used herein, "comprise" and/or "comprising" refers to the specific existence of the recited shapes, numbers, steps, actions, members, elements and/or groups, and does not exclude the presence or addition of one or more other shapes, numbers, actions, members, elements and/or groups.

In this specification, it should be noted that the individual components may be integral with other components or separate from other components as necessary or desired, and there is no separate limitation thereto.

In the following, for convenience of description of the device layout, the x-axis direction is referred to as the "first direction" and the y-axis direction is referred to as the "second direction".

Figure 2:
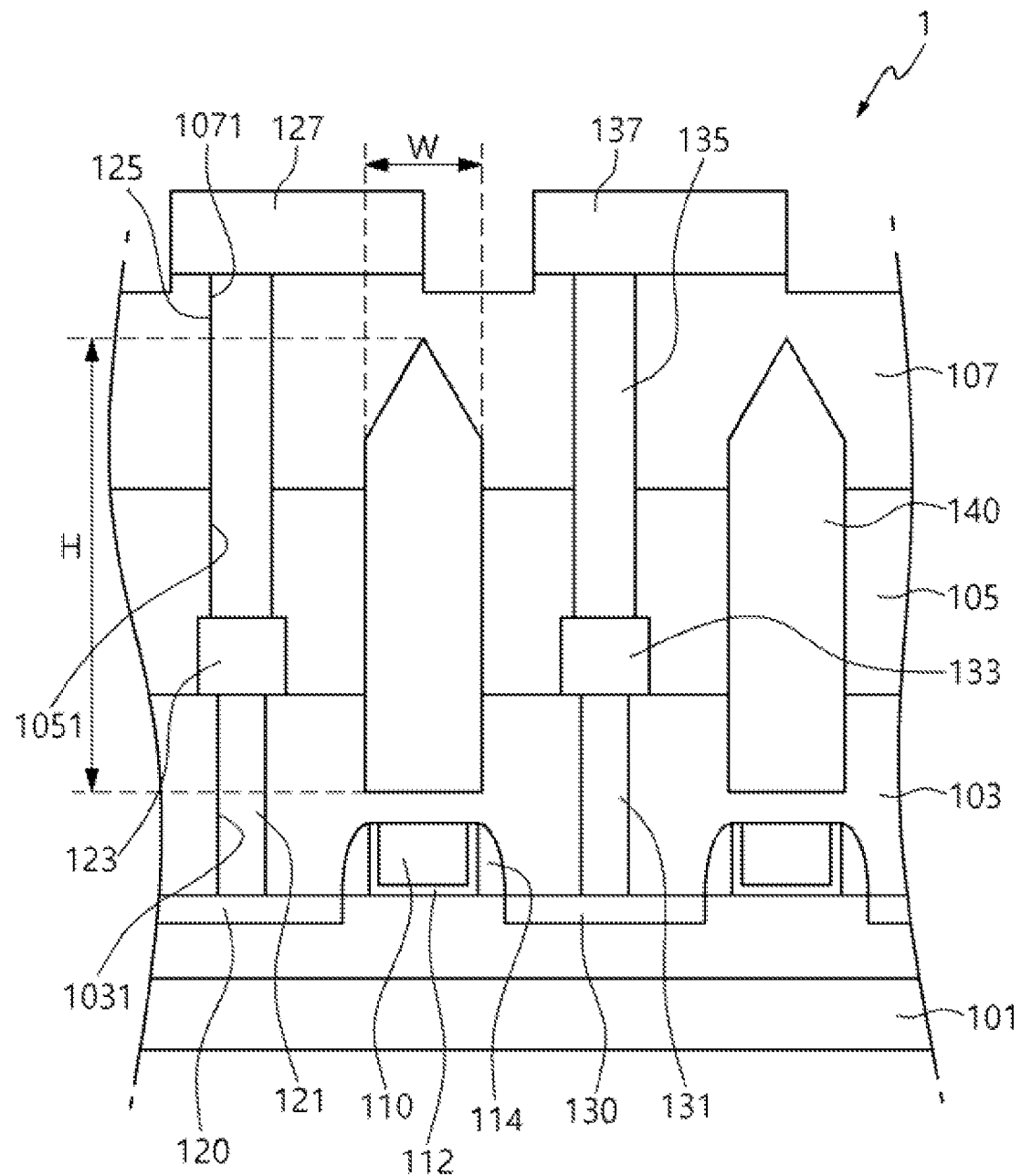
FIG. 2 is a partial cross-sectional view of an RF switch device according to the present disclosure.

FIG. 2 is a partial cross-sectional view of an RF switch device according to the present disclosure.

Hereinafter, an RF switch device 1 according to one or more embodiments of the present disclosure will be described in detail with reference to the accompanying drawings.

Referring to FIG. 2, the present disclosure relates to an RF switch device 1 and, more particularly, to an RF switch device 1 having an air gap above a gate electrode and a metal interconnect above the air gap to at least partially overlap the air gap in the vertical direction, thereby preventing exposure of the air gap in subsequent processing. In addition, hereinafter, certain structures and configuration(s) in an active region of the device and below the drain and source terminals will be omitted for convenience of description. For example, a body region, a drift region, etc. may be present in the active region.

First, a plurality of transistors, for example, field effect transistors are formed on a semiconductor layer 101, and the transistors may include a gate electrode 110, a source 120, and a drain 130, which will be described in detail below. Additionally, the switch device 1 may have a multi-finger structure, in which transistors are electrically connected to each other.

A lower insulating layer 103 is formed on the semiconductor layer 101, an intermediate insulating layer 105 is formed on the lower insulating layer 103, and an upper insulating layer 107 is formed on the intermediate insulating layer 105. That is, the lower insulating layer 103, the intermediate insulating layer 105, and the upper insulating layer 107 may be sequentially stacked on the semiconductor layer 101. The insulating layers 103, 105, and 107 may comprise, for example, an oxide (e.g., silicon dioxide, which may be doped or undoped) film, a nitride (e.g., silicon nitride) film, and/or a carbon-containing film (e.g., silicon oxycarbide, which may or may not be hydrogenated), and the scope of the present disclosure is not limited by specific examples.

First contact holes 1031 extending in the vertical direction may be spaced apart from each other in the lower insulating layer 103. The first contact holes 1031 include a first source contact 121 and a first drain contact 131, which will be described later. Second contact holes 1051 and third contact holes 1071 may respectively extend along the vertical direction in the middle insulating layer 105 and the upper insulating layer 107, and include a second source contact 125 and a second drain contact 135.

The gate electrode 110 is on the semiconductor layer 101. In addition, a gate insulating film 112 is between the gate electrode 110 and the semiconductor layer 101. The source 120 and the drain 130 are in the semiconductor layer 101 on opposite sides of the gate electrode 110. The gate electrode 110 may generally comprise a conductive polysilicon, a metal, a conductive metal nitride, or a combination thereof. The gate electrode 110 may be formed using one or more known processes, such as chemical vapor deposition (CVD), physical vapor deposition (PVD), atomic layer deposition (ALD), metalorganic ALD (MOALD), or metalorganic CVD (MOCVD), and photolithographic patterning and etching processes, and there is no particular limitation thereto. A gate spacer 114 that may comprise, for example, an oxide (e.g., silicon dioxide) film, a nitride (e.g., silicon nitride) film, or a combination thereof may be formed on the sidewalls of the gate electrode 110 and the gate insulating film 112.

The source 120 is a high-concentration impurity region on the surface of or in the semiconductor layer 101. The first source contact 121 is on (e.g., connected to) the source 120 and passes through the lower insulating layer 103. To be more specific, the first source contact 121 is in the first contact hole 1031. The lowermost surface or end of the first source contact 121 substantially coincides with the lowermost surface of the lower insulating layer 103. The first source contact 121 may comprise a metal such as copper, aluminum or tungsten, but the scope of the present disclosure is not limited by specific examples.

A first metal interconnect 123 comprising a metal such as aluminum is on the first source contact 121, and the first metal interconnect 123 may be electrically connected to the first source contact 121. The second source contact 125 which passes through the intermediate insulating layer 105 and the upper insulating layer 107 and which comprises, for example, a metal such as copper, aluminum, or tungsten is on the metal interconnect 123, and to be more specific, the second source contact 125 is in a corresponding contact hole (e.g., a second contact hole 1051 and, to the extent it can be considered a separate structure, a third contact hole 1071). In addition, the second source contact 125 is electrically connected to the first metal interconnect 123 because a lower portion thereof is in contact with the first metal interconnect 123. A second metal interconnect 127 comprising a metal such as aluminum is on and is electrically connected to the second source contact 125.

The drain 130 is on the surface of or in the semiconductor layer 101. A first drain contact 131 is on the drain 130 and a third metal interconnect 133 is on the first drain contact 131. A second drain contact 135 is on the third metal interconnect 133, and a fourth metal interconnect 137 is on the second drain contact 135. Each of these components is substantially the same as the first source contact 121, the first metal interconnect 123, the second source contact 125, and the second metal interconnect 125, respectively, and is preferably arranged in the same manner. A detailed description thereof will be omitted.

In addition, although the thickness of each of the metals 123, 127, 133, and 137 is inversely proportional to the on-resistance, the metals 123, 127, 133, and 137 may have a thickness greater than or equal to a certain value within a range that does not cause a problem in device integration.

An air gap 140 is formed over each gate electrode 110. More specifically, the air gap 140 (which may comprise air or another gas or mixture of gases) is between the first metal interconnect 123 and the third metal interconnect 133 and in a space below a gap between the second metal interconnect 127 and the fourth metal interconnect 137. The air gap 140 may have a predetermined width W and a predetermined height H.

Hereinafter, the configuration and problems of the conventional RF switch device 9 and embodiments of the present disclosure for solving the problems will be described in detail.

Figure 1:
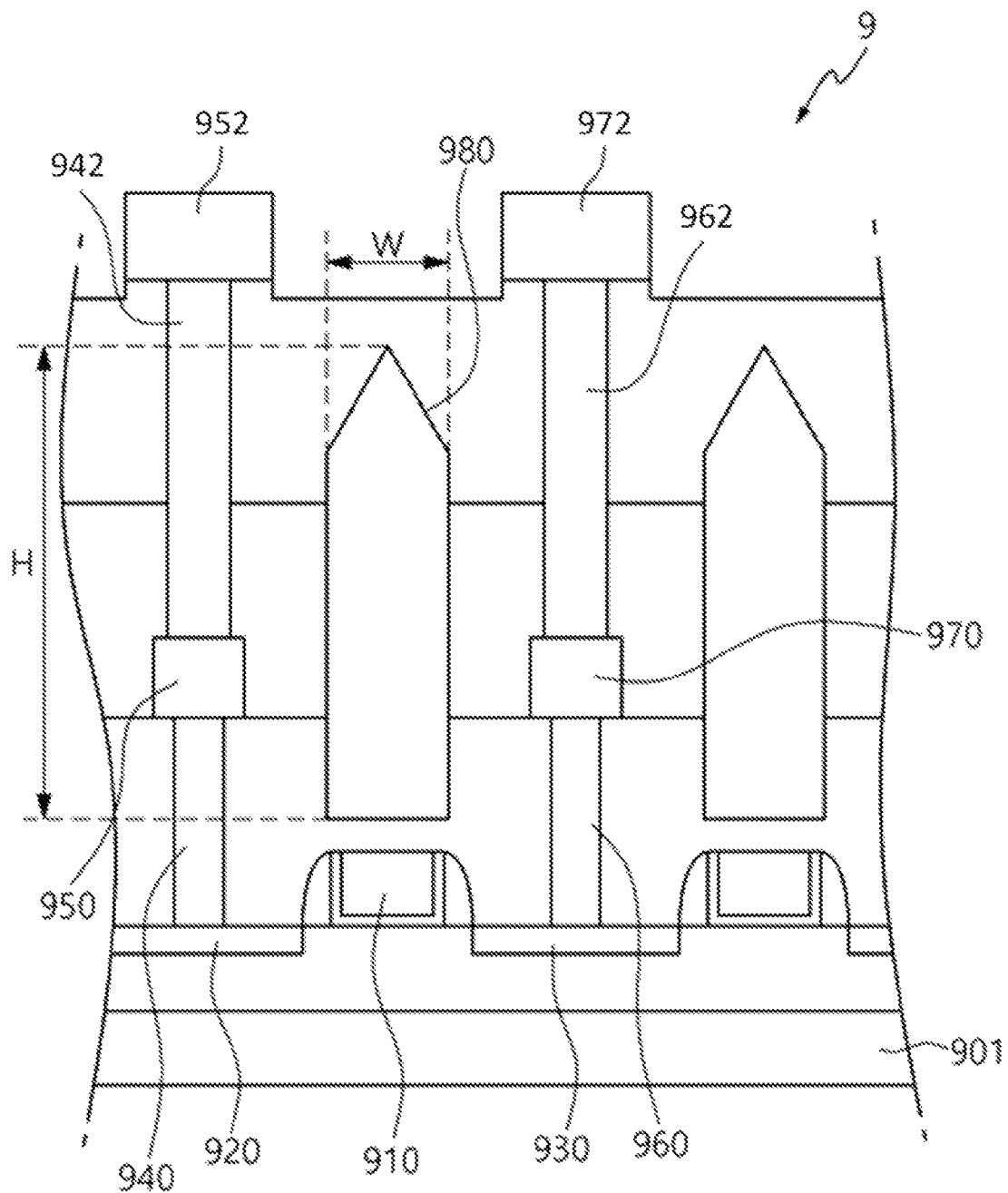
FIG. 1 is a partial cross-sectional view of a conventional RF switch device.

Referring to FIG. 1, semiconductor devices are becoming highly integrated, and accordingly, the separation distance between the metal interconnects at the same level tends to get smaller in successive generations of device manufacturing technology. However, as the metal interconnects become closer together, crosstalk occurs between the adjacent metal interconnects, and parasitic capacitance increases.

That is, as the size of the semiconductor device decreases, the parasitic capacitance through coupling between the metal interconnects naturally occurs, and the increase in parasitic capacitance increases the delay constant (RC), which is inversely proportional to the signal propagation speed. In short, the increase in parasitic capacitance lowers the overall signal propagation speed of the device, resulting in deterioration of semiconductor device characteristics. This problem also occurs in a radio frequency (RF) switch device, thus the figure of merit (FOM) of the RF switch device, which may be quantified as the product of on-resistance (Rsp) and parasitic capacitance, may increase.

In order to prevent such deterioration of device characteristics, a thick insulating film may cover the air gap 980, the height H of the air gap 990 may be decreased. However, in the former case, the depth of the via also increases, making the corresponding process relatively difficult, which may be a factor in an increase in cost. In the latter case, the air gap may not reduce parasitic capacitance as much as desired.

Figure 3:
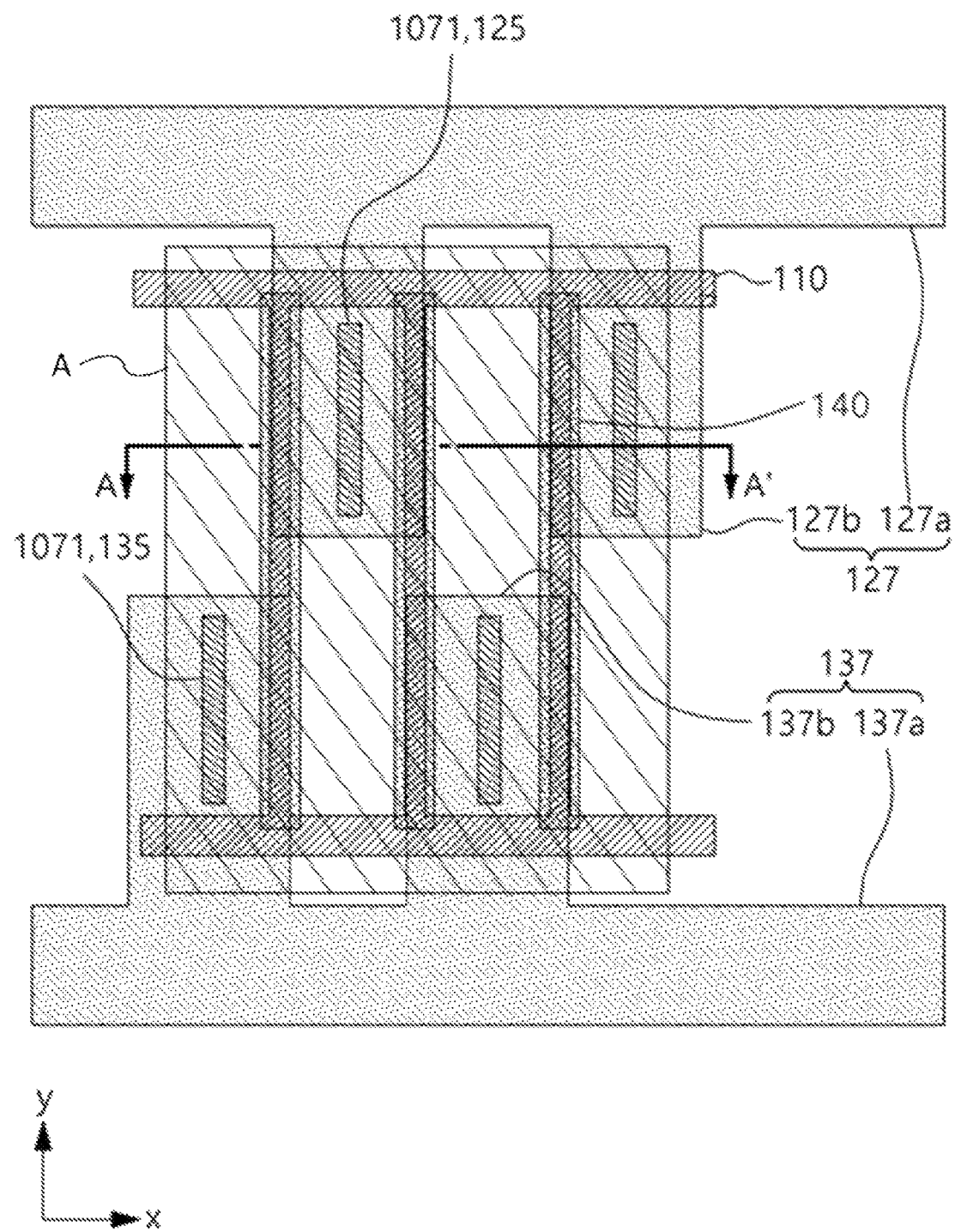
FIG. 3 is a plan view of an RF switch device according to a first embodiment of the present disclosure.
Figure 4:
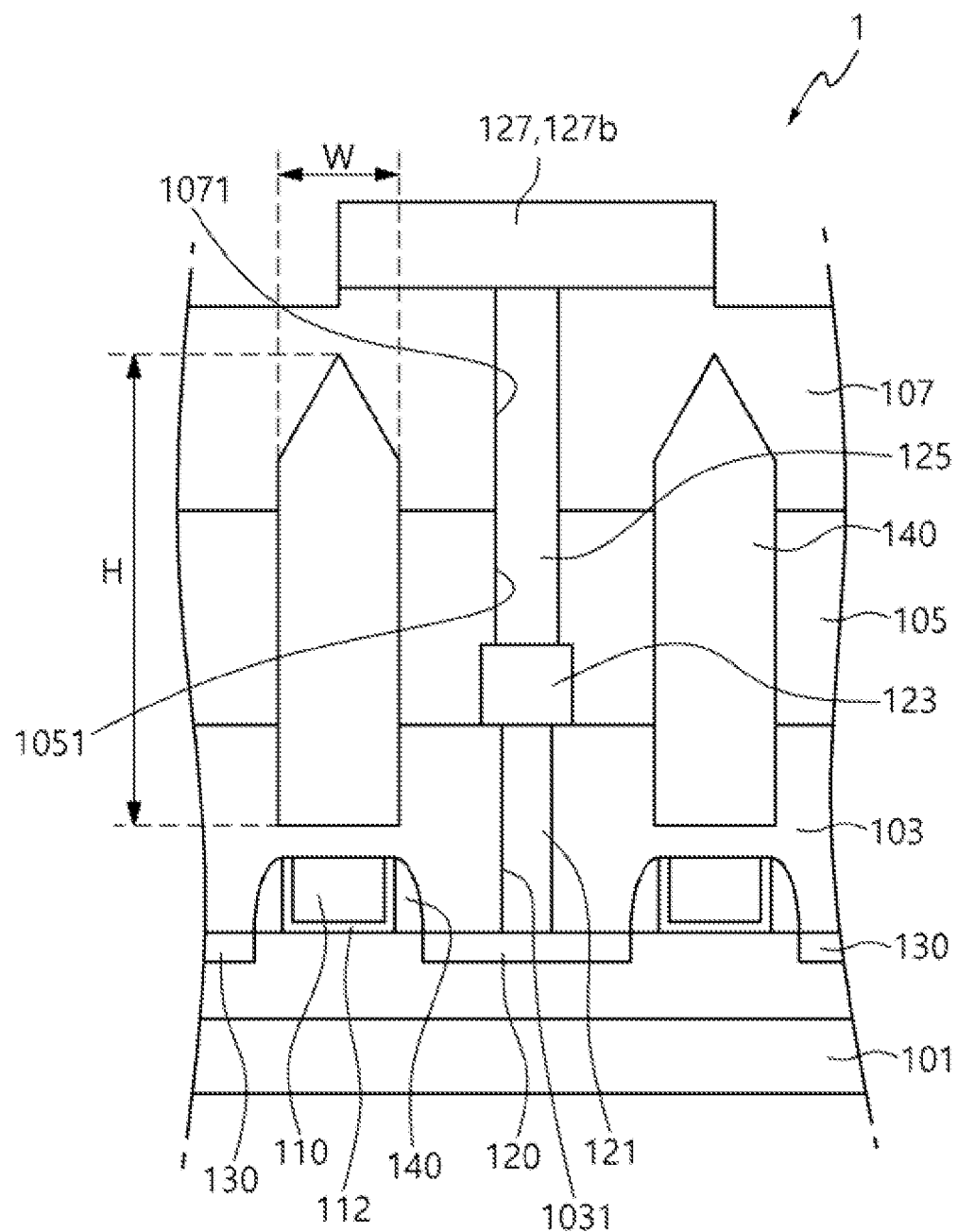
FIG. 4 is a cross-sectional view of the RF switch device taken along line A-A' of FIG. 3.
Figure 5:
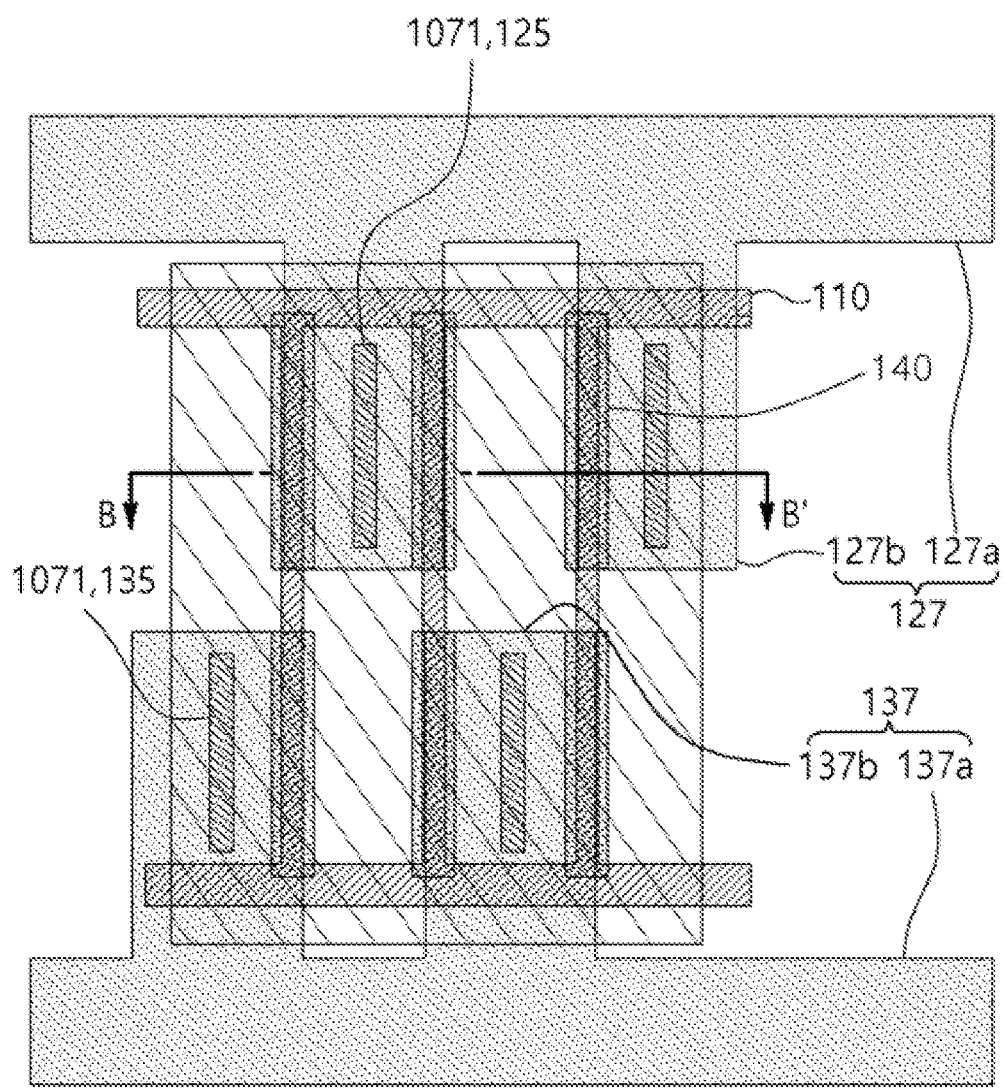
FIG. 5 is a plan view of an RF switch device according to a second embodiment of the present disclosure.
Figure 6:
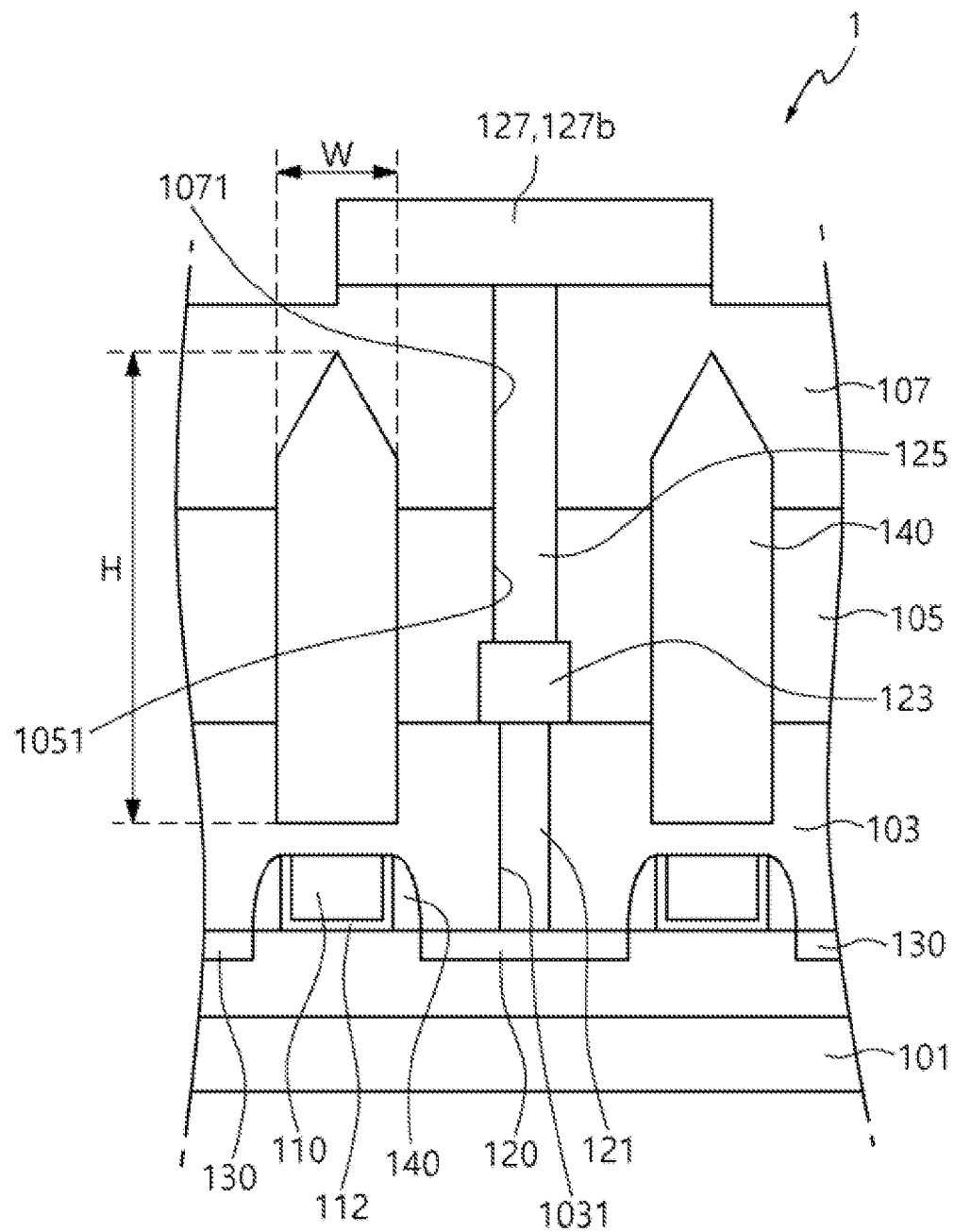
FIG. 6 is a cross-sectional view of the RF switch device taken along line B-B' of FIG. 5.
Figure 7:
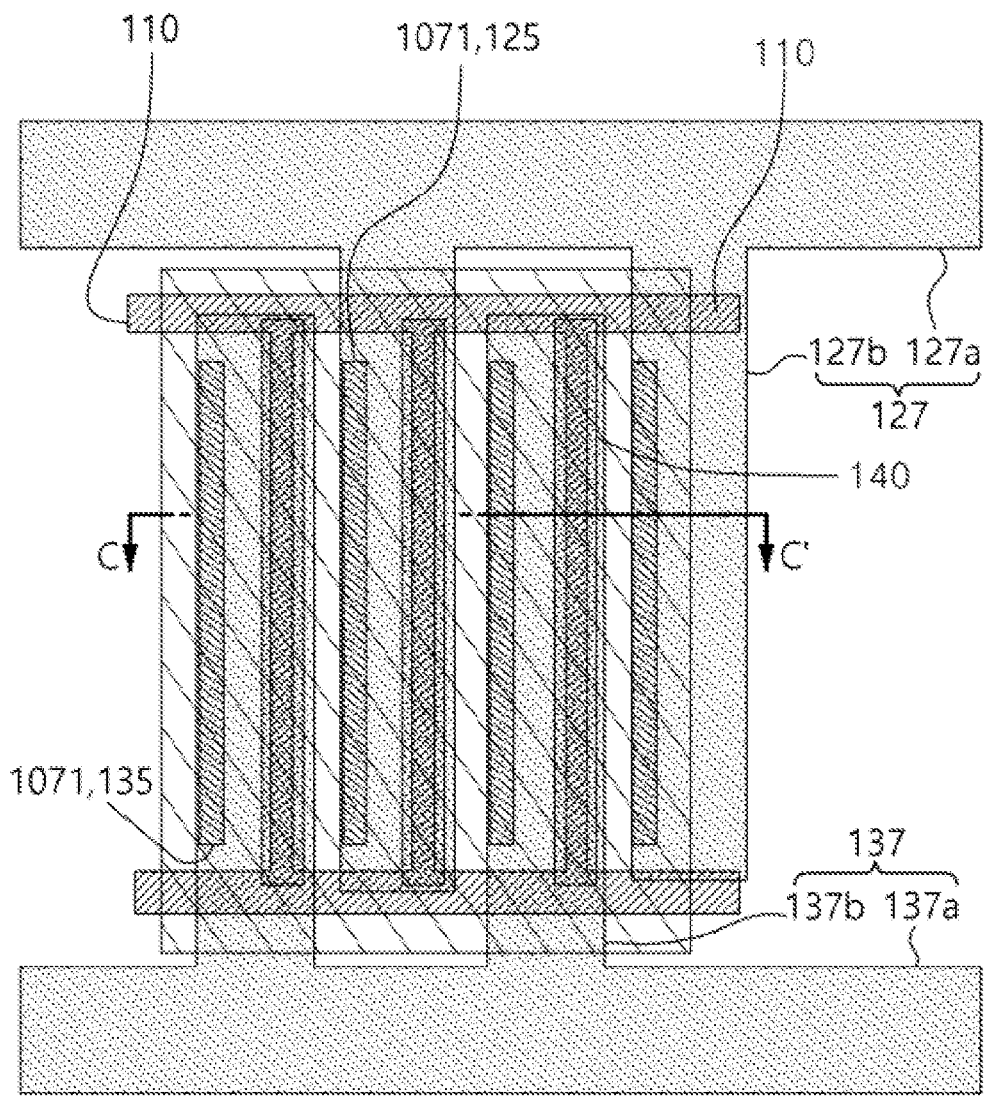
FIG. 7 is a plan view of an RF switch device according to a third embodiment of the present disclosure.
Figure 8:
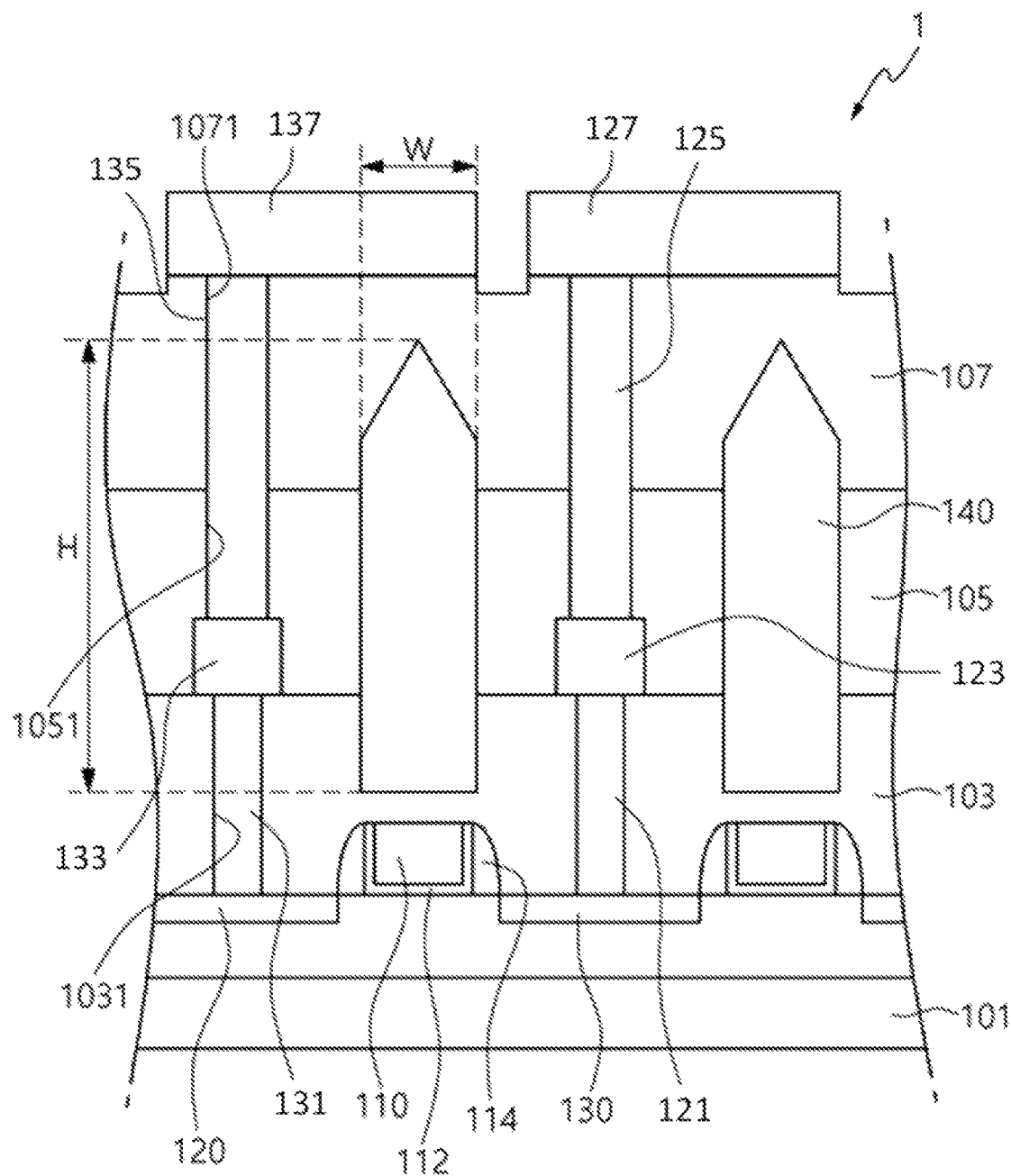
FIG. 8 is a cross-sectional view of the RF switch device taken along line C-C' of FIG. 7.
Figure 9:
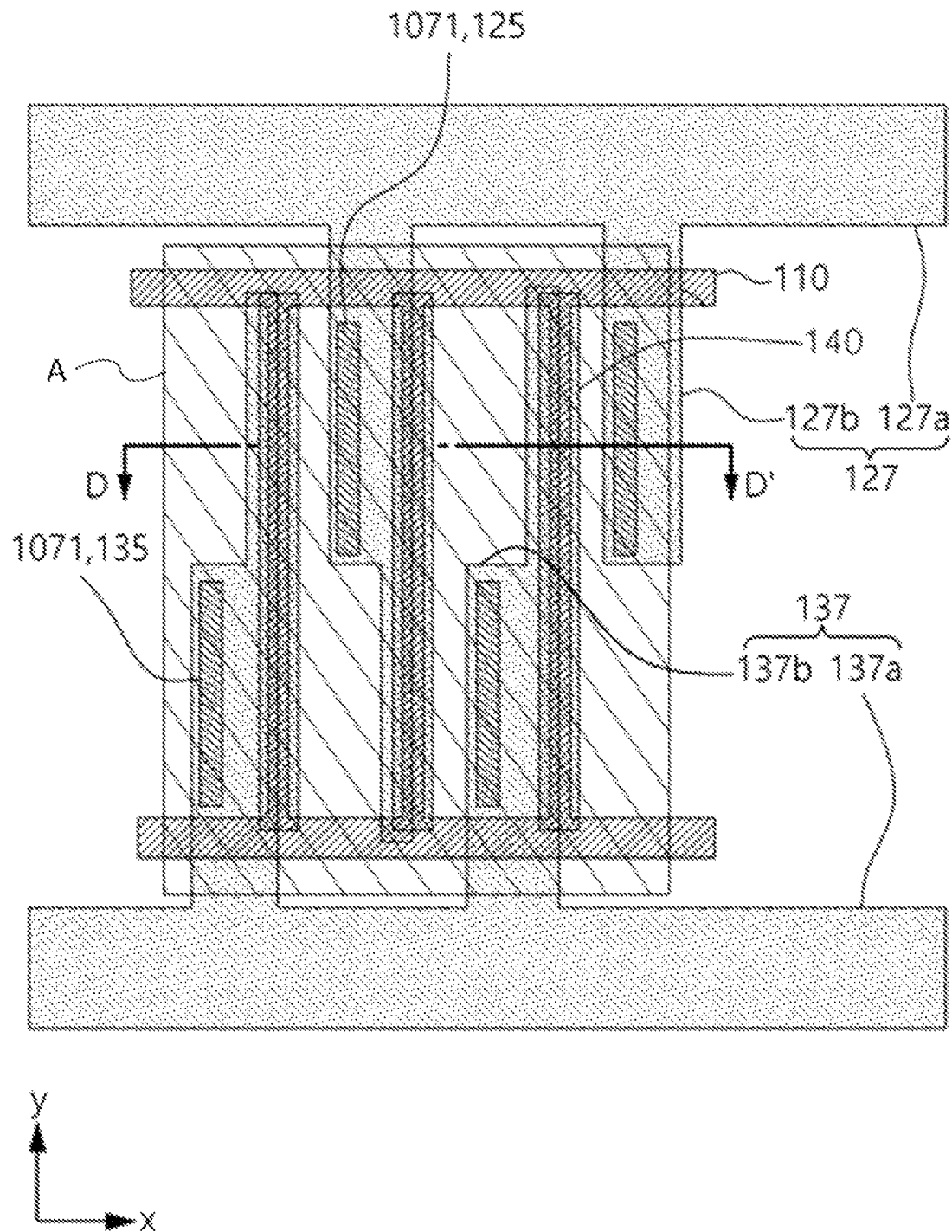
FIG. 9 is a plan view of an RF switch device according to a fourth embodiment of the present disclosure.
Figure 10:
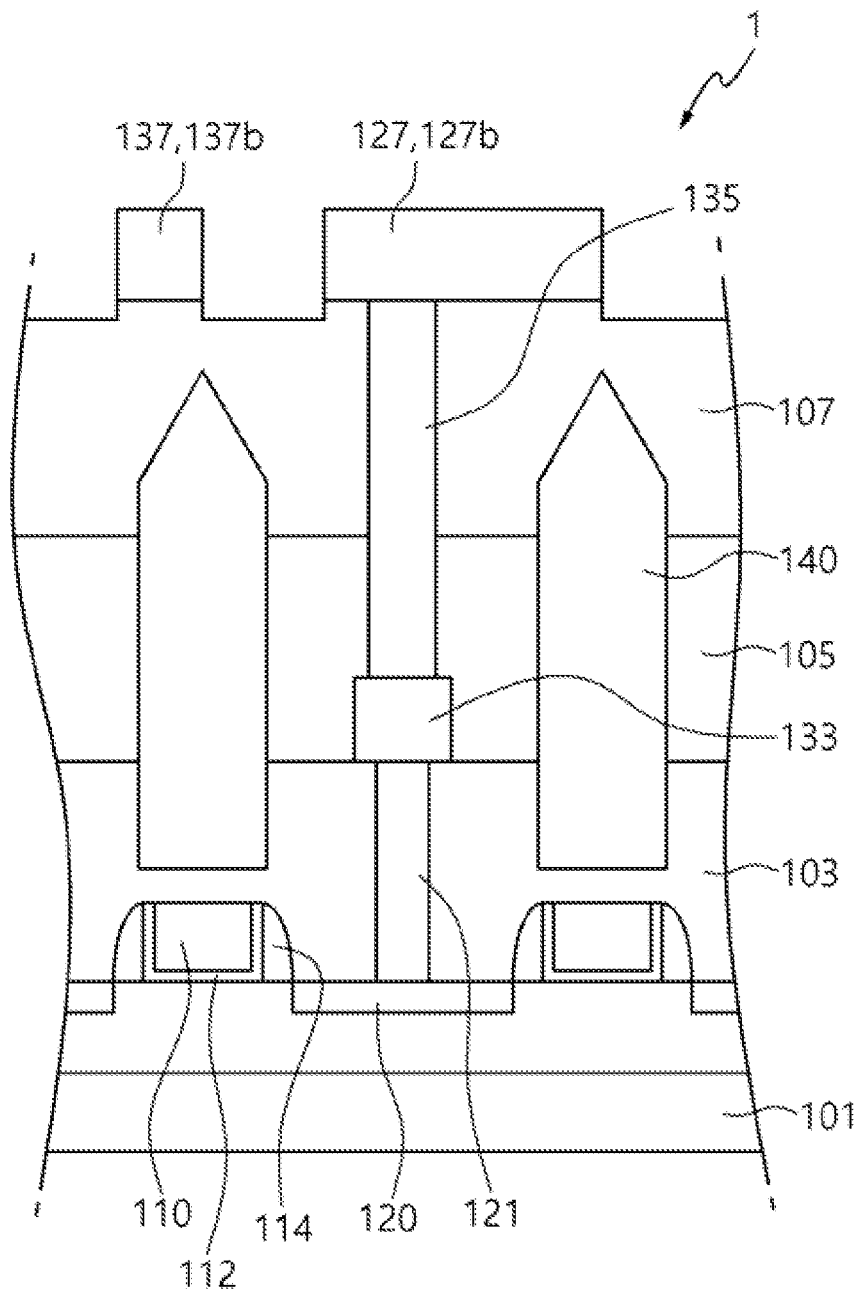
FIG. 10 is a cross-sectional view of the RF switch device taken along line D-D' of FIG. 9.
Figure 11:
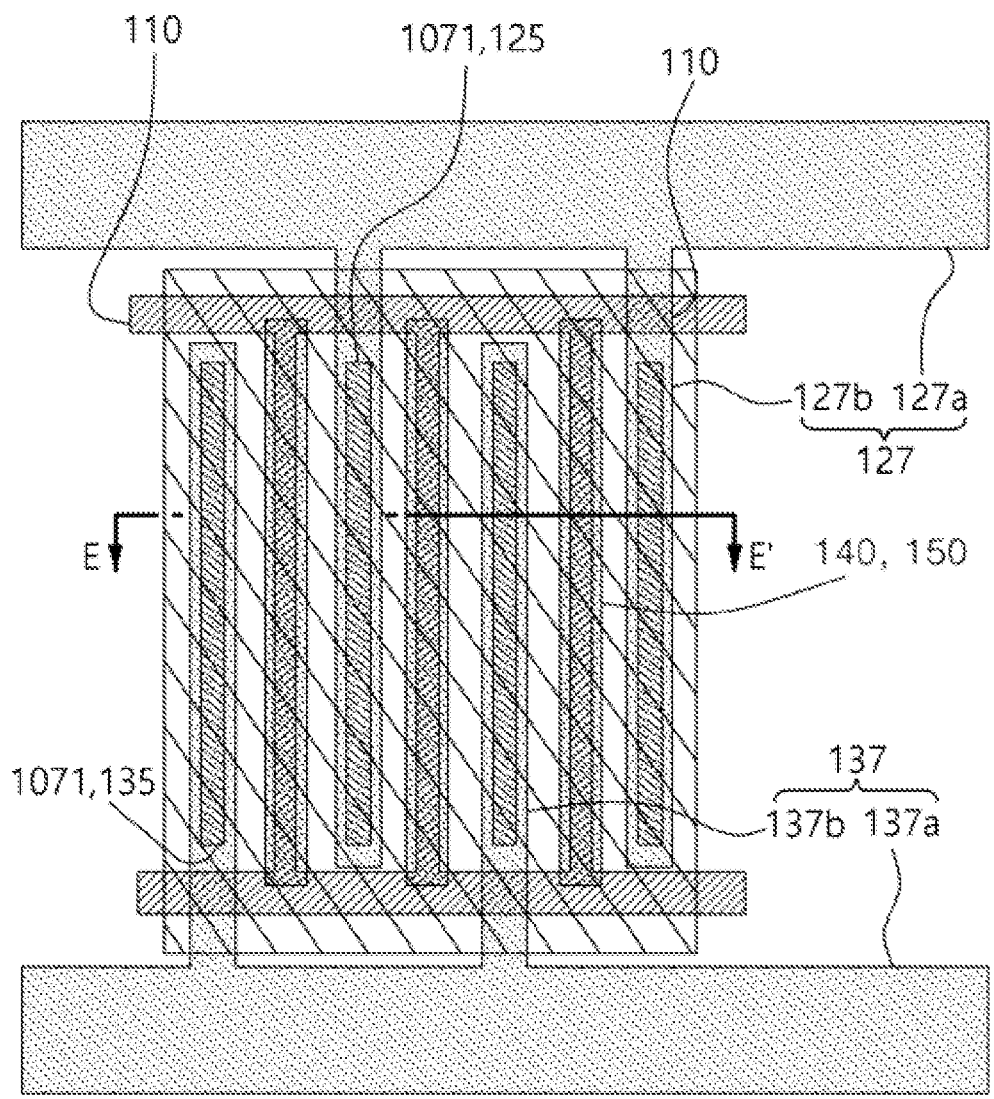
FIG. 11 is a plan view of an RF switch device according to a fifth embodiment of the present disclosure.
Figure 12:
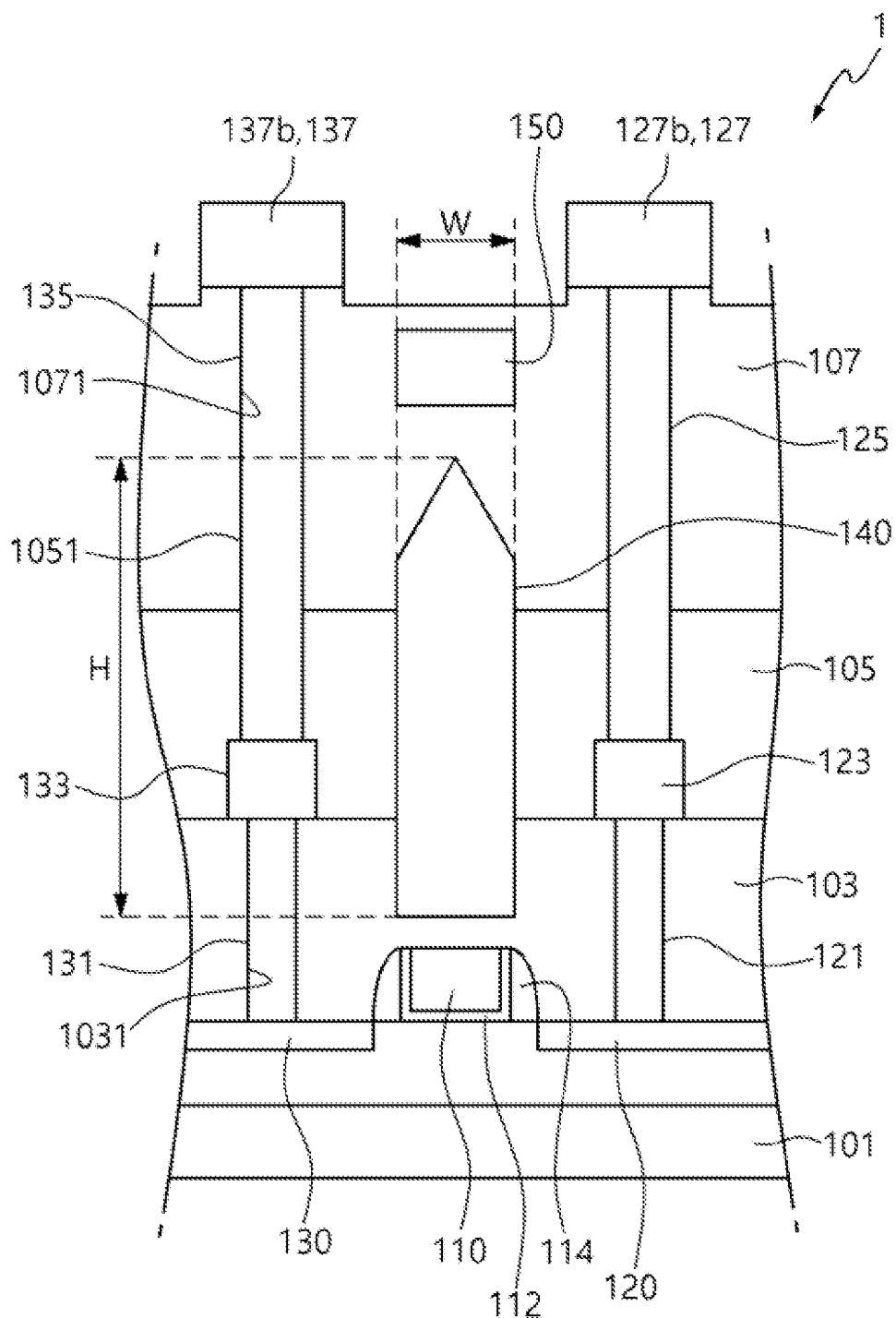
FIG. 12 is a cross-sectional view of the RF switch device taken along line E-E' of FIG. 11.
Figure 13:
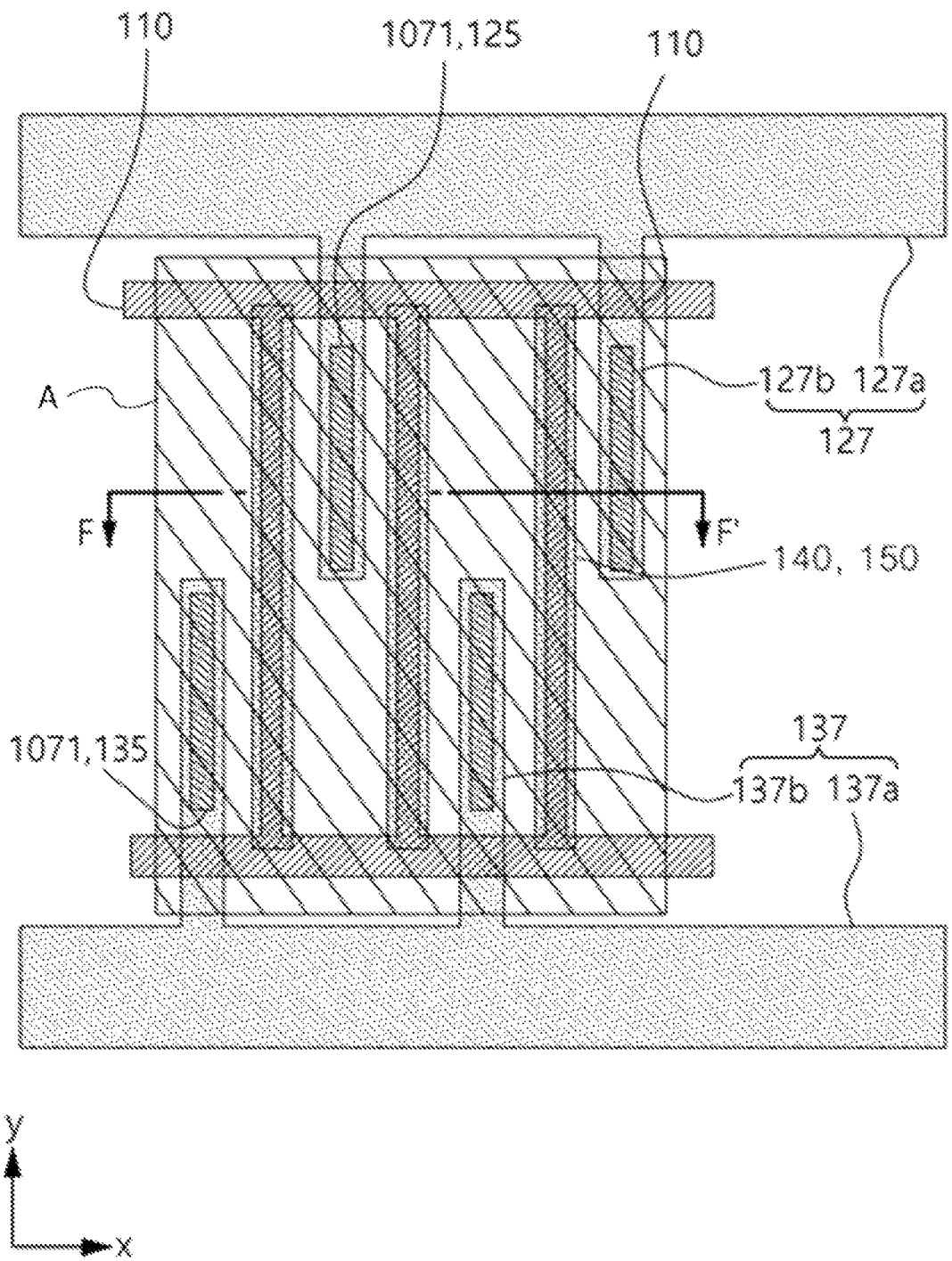
FIG. 13 is a plan view of an RF switch device according to a sixth embodiment of the present disclosure.
Figure 14:
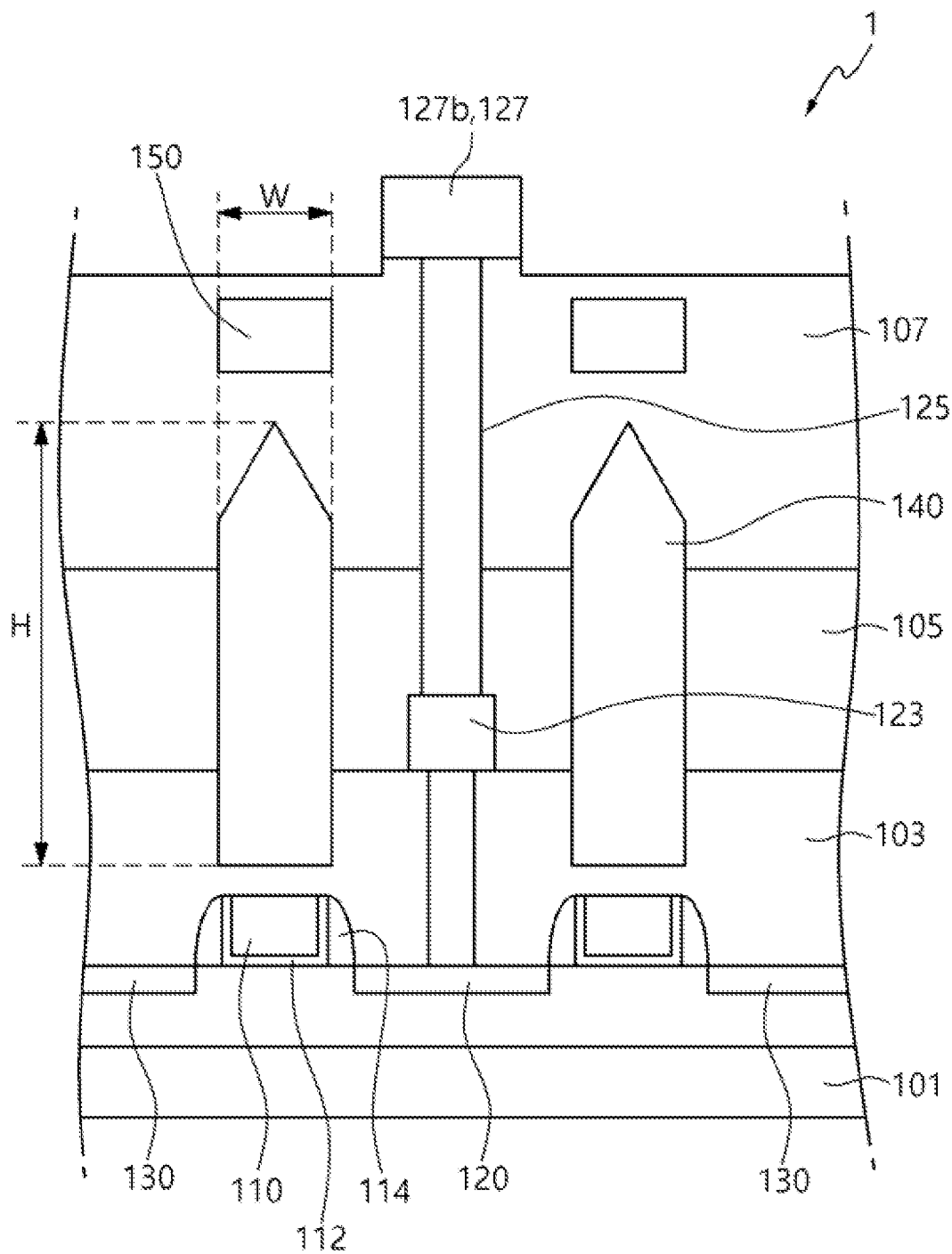
FIG. 14 is a cross-sectional view of the RF switch device taken along line F-F' of FIG. 13.

FIG. 3 is a plan view of an RF switch device according to a first embodiment of the present disclosure; FIG. 4 is a cross-sectional view of the RF switch device taken along the line A-A' of FIG. 3; FIG. 5 is a plan view of an RF switch device according to a second embodiment of the present disclosure; FIG. 6 is a cross-sectional view of the RF switch device taken along the line B-B' of FIG. 5; FIG. 7 is a plan view of an RF switch device according to a third embodiment of the present disclosure; FIG. 8 is a cross-sectional view of the RF switch device taken along the line C-C' of FIG. 7; FIG. 9 is a plan view of an RF switch device according to a fourth embodiment of the present disclosure; FIG. 10 is a cross-sectional view of the RF switch device taken along the line D-D' of FIG. 9; FIG. 11 is a plan view of an RF switch device according to a fifth embodiment of the present disclosure; FIG. 12 is a cross-sectional view of the RF switch device taken along the line E-E' of FIG. 11; FIG. 13 is a plan view of an RF switch device according to a sixth embodiment of the present disclosure; and FIG. 14 is a cross-sectional view of the RF switch device taken along the line F-F' of FIG. 13.

In order to solve above-mentioned problems, the RF switch device 1 according to the present disclosure has the following layout.

Referring to FIG. 3, in the RF switch device 1, the second metal interconnect 127 has a source tab 127a extending along a first direction (e.g., the x direction), electrically connected to individual source extension portions 127b, and the source extension portions 127b may extend in a second direction (e.g., the y direction) from one side of the source tab 127a and be spaced apart from each other in the first direction. The fourth metal interconnect 137 also has a drain tab 137a extending along the first direction, electrically connected to individual drain extension portions 137b, and the drain extension portions 137b may extend in the second direction from one side of the drain tab 137a and be spaced apart from each other in the first direction. The gate electrodes 110 may have one or more portions extending in the second direction, and when there is more than one such portion, they may be spaced apart from each other in the first direction. The gate electrodes 110 may also have one or more portions extending in the first direction. The separate portions of the gate electrodes 110 may each have a rectangular shape in the layout view of FIGS. 3, 5, 7, 9, 11 and 13. Each of the gate electrodes 110 is on or over the active region A. In addition, one or more air gaps 140 are over the gate electrodes 110, and first to third contact holes 1031, 1051, and 1071 are below each of the source extensions 127b and drain extensions 137b.

A first embodiment of the present disclosure will be described with reference to FIGS. 3 and 4. Here, each of the source extension portions 127b and drain extension portions 137b may cover at least part of the air gaps 140 over the adjacent gate electrodes 110. That is, sides of the second metal interconnect 127 or the fourth metal interconnect 137 in the first direction may cover at least half of the width W of each of the adjacent air gaps 140. In addition, the source extension portions 127b and the drain extension portions 137b may extend in the second direction to a length less than half of the length of the adjacent air gap 140 in the second direction. Accordingly, the source extension portion 127b and the drain extension portion 137b may not overlap each other along the first direction.

In the air gap 140, the side or end at risk of exposure in subsequent processing is the uppermost end or side, so if only the uppermost end or side is covered, the possibility of exposure problems in subsequent processing may be minimized. In addition, in this first embodiment, the width of the second metal interconnect 127 and the fourth metal interconnect 137 in the first direction increases relative to the conventional device in FIG. 1, which means that the on-resistance may improve. Further, compared to the conventional semiconductor device, the parasitic capacitance may decrease to further improve the on-resistance characteristic by reducing the number of source extension portions 127b and/or drain extension portions 137b (which may be over alternating source/drain terminals along the first direction and/or on only one side of a source/drain terminal along the second direction).

A second embodiment of the present disclosure will be described with reference to FIGS. 5 and 6. The second embodiment has substantially the same structure as the first embodiment, but in the first direction, the air gap 140 may not be over the gate electrode 140 in a location where the second source extension portion 127b and the drain extension portion 137b do not overlap (e.g., the air gaps 140 may not be present in areas under gaps between adjacent source extension portions 127b and drain extension portions 137b).

A third embodiment of the present disclosure will be described with reference to FIGS. 7 and 8. Here, the width of the source extension portion 127b or the drain extension portion 137b in the first direction covers at least half of the width W of the adjacent air gap 140. For example, the width in the first direction of the second metal interconnect 127 and/or the fourth metal interconnect 137 may cover at least the uppermost surface of the adjacent air gap 140. Of course, as shown in FIGS. 7 and 8, the metals 127 and 137 may cover the entire width W of the adjacent air gap 140.

A fourth embodiment of the present disclosure will be described with reference to FIGS. 9 and 10. As in the third embodiment, the width of the source extension portion 127b or the drain extension portion 137b in the first direction covers at least half of the width W of an adjacent air gap 140. The contact hole portions 1071 (and preferably contact hole portions 1051 and first contact holes 1031) have a length in the second direction that is less than half the length of a corresponding gate electrode 110 in the second direction. The active area A may be viewed as having two sides along the second direction, one containing only source contacts 121 and 125, and the other containing only drain contacts 131 and 135. The width (in the first direction) of the source extension portions 127b and the drain extension portions 137b on the side of the active area A not in contact with any contacts in the contact holes 1071, 1051 and 1031 may be smaller than the width of the source extension portions 127b and the drain extension portions 137b on the side of the active area A in contact with contacts in the contact holes 1071, 1051 and 1031. In addition, the contact holes 1071, 1051 and 1031 are alternatingly offset from each other along the first direction (e.g., on opposite sides of the active area A). At this time, the alternating pattern means that when one set of contact holes 1071, 1051 and 1031 extends along the second direction on the side of the active area A adjacent to the source tab 127a, adjacent sets of contact holes 1071, 1051 and 1031 in the first direction extend along the second direction in the side of the active area A adjacent to the drain tab 137a. In other words, the contact holes for the source contacts 121 and 125 and the contact holes for the drain contacts 131 and 135 do not overlap each other along the first direction. In this way, parasitic capacitance between the second metal interconnect 127 and the adjacent fourth metal interconnect 137 may be minimized.

A fifth embodiment of the present disclosure will be described with reference to FIGS. 11 and 12. In this embodiment, a floating metal 150 extending along the second direction is over the at least one air gap 140. The floating metal 150 may be at a height between the first metal interconnect 123 and the second metal interconnect 127, but is not connected to any metal contact or metal interconnect. In addition, the floating metal 150 may cover the entire width W of the air gap 140, or only part (e.g., half or more) of the air gap 140, and there is no particular limitation thereto. The floating metal 150 may be formed by depositing the upper insulating layer 107 in two separate processes, and forming the floating metal 150 between the two deposition processes. For example, after forming a lower portion of the upper insulating layer 107, a metal layer may be deposited on the lower portion, and the floating metal 150 may be formed by a photolithographic patterning process, followed by an etching process. Thereafter, the upper portion of the upper insulating layer 107 may be deposited onto the floating metal 150 and the exposed lower portion of the upper insulating layer 107.

A sixth embodiment of the present disclosure will be described with reference to FIGS. 13 and 14. As in the fifth embodiment, the floating metal 150 is present, and the contact holes/hole portions 1071, 1051 and 1031 are alternately arranged along the first direction. In addition, the source extension portion(s) 127b and the drain extension portion(s) 137b may be only on the side of the active area A with the corresponding source or drain contacts. In this way, parasitic capacitance between adjacent metal structures may be minimized.

The above detailed description is illustrative of the present disclosure. In addition, the above description shows and describes preferred embodiments of the present disclosure, and the present disclosure can be used in various other combinations, modifications, and environments. That is, changes or modifications are possible within the scope of the concept of the disclosure disclosed herein, the scope equivalent to the written disclosure, and/or within the scope of skill or knowledge in the art. The above-described embodiments represent implementations of the technical ideas of the present disclosure, and various changes for specific application fields and uses of the present disclosure are possible. Accordingly, the detailed description of the present disclosure is not intended to limit the present disclosure to the disclosed embodiments.

The invention claimed is:

1. An RF switch device, comprising:
a semiconductor layer;
a gate electrode on the semiconductor layer;
a source on the semiconductor layer;
a drain on the semiconductor layer;
a first source contact connected to the source;
a first metal interconnect connected to the first source contact;
a second source contact connected to the first metal interconnect;
a second metal interconnect connected to the second source contact;
a first drain contact connected to the drain;
a third metal interconnect connected to the first drain contact;
a second drain contact connected to the third metal interconnect;
a fourth metal interconnect connected to the second drain contact; and
air gaps over the gate electrodes and below the second metal interconnect and the fourth metal interconnect,
wherein the second metal interconnect includes:
a source tab extending along a first direction and electrically connected to a plurality of source extension portions; and
the plurality of source extension portions, extending in a second direction from a first side of the source tab, spaced apart from each other in the first direction, the fourth metal interconnect includes:
a drain tab extending along the first direction and electrically connected to a plurality of drain extension portions and spaced apart from the source tab in the second direction; and
the plurality of drain extension portions extending in the second direction from the first side of the drain tab, spaced apart from each other in the first direction, and
each of the second source extension portions and the second drain extension portions have a width sufficient to cover an uppermost end of an adjacent one of the air gaps.

2. The RF switch device of claim 1, further comprising:
a lower insulating layer on the semiconductor layer;
an intermediate insulating layer on the lower insulating layer; and
an upper insulating layer on the middle insulating layer,
wherein the lower insulating layer includes a first contact hole through which the first source contact and the first drain contact pass,
the intermediate insulating layer includes a second contact hole through which the second source contact and the second drain contact pass, and
the upper insulating layer includes a third contact hole through which the second source contact and the second drain contact pass.

3. The RF switch device of claim 2, wherein adjacent ones of the second source extension portions and the second drain extension portions do not overlap each other along the first direction.

4. The RF switch device of claim 3, wherein the air gaps are not in a location below a gap between adjacent ones of the second source extension portions and the drain extension portions.

* * * * *